US012641711B2

(12) United States Patent
Sapozhnikov et al.

(10) Patent No.: US 12,641,711 B2
(45) Date of Patent: May 26, 2026

(54) MANAGING CROSSTALK FOR HIGH DATA RATE INTERFACES

(71) Applicant: Cisco Technology, Inc., San Jose, CA (US)

(72) Inventors: Mike Sapozhnikov, San Jose, CA (US); Joel Richard Goergen, Soulsbyville, CA (US); David Nozadze, San Jose, CA (US); Amendra Koul, San Francisco, CA (US); Sayed Ashraf Mamun, San Jose, CA (US); Upen Reddy Kareti, Union City, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 168 days.

(21) Appl. No.: 18/437,710

(22) Filed: Feb. 9, 2024

(65) Prior Publication Data

US 2025/0261301 A1     Aug. 14, 2025

(51) Int. Cl.
H05K 1/02          (2006.01)
H05K 3/34          (2006.01)

(52) U.S. Cl.
CPC ......... H05K 1/0219 (2013.01); H05K 1/0298 (2013.01); H05K 3/34 (2013.01); *H05K 2201/09218* (2013.01)

(58) Field of Classification Search
CPC ...... H05K 1/0219; H05K 1/0298; H05K 3/34; H05K 2201/09218
USPC ......................................................... 174/255
See application file for complete search history.

(56) References Cited

U.S. PATENT DOCUMENTS

| | | | | |
|---|---|---|---|---|
| 6,444,922 | B1 * | 9/2002 | Kwong .................... | H05K 1/14 |
| | | | | 174/255 |
| 2002/0000126 | A1 * | 1/2002 | Barclay .............. | G01M 13/045 |
| | | | | 702/56 |
| 2008/0245556 | A1 | 10/2008 | Bird et al. | |
| 2014/0203417 | A1 | 7/2014 | Altunyurt et al. | |
| 2017/0271793 | A1 * | 9/2017 | Edet ....................... | H01R 12/71 |
| 2018/0184515 | A1 | 6/2018 | Anand et al. | |
| 2022/0217835 | A1 | 7/2022 | Mariscal | |

FOREIGN PATENT DOCUMENTS

EP          1861893 A1 * 12/2007

* cited by examiner

*Primary Examiner* — Andargie M Aychillhum
(74) *Attorney, Agent, or Firm* — Edell, Shapiro & Finnan, LLC

(57) ABSTRACT
A device is provided that includes a printed circuit board having a top surface, a first trace disposed directly on the top surface of the printed circuit board, and a second trace disposed directly on the top surface of the printed circuit board adjacent the first trace. A first metal dome is positioned over the first trace and is configured to block crosstalk between the first trace and the second trace.

20 Claims, 6 Drawing Sheets

402

INSTALLING A FIRST TRACE DIRECTLY ON A TOP SURFACE OF A PRINTED CIRCUIT BOARD

404

INSTALLING A SECOND TRACE DIRECTLY ON THE TOP SURFACE OF THE PRINTED CIRCUIT BOARD ADJACENT THE FIRST TRACE

406

POSITIONING A FIRST METAL DOME OVER THE FIRST TRACE TO BLOCK CROSSTALK BETWEEN THE FIRST TRACE AND THE SECOND TRACE

400

MANAGING CROSSTALK FOR HIGH DATA RATE INTERFACES

TECHNICAL FIELD

The present disclosure relates to networking equipment.

BACKGROUND

To save costs while enabling high performance device design, printed circuit boards frequently are constructed using high loss materials and as few layers as possible. To enable fewer layers, much of the signal routing is placed on the microstrip or external layers of the printed circuit board. Microstrip routing is susceptible to crosstalk due to a lack of balanced dielectric material on the sides of the microstrips. In some cases, crosstalk between microstrips can lead to signal degradation.

DETAILED DESCRIPTION

Overview

Figure 1:
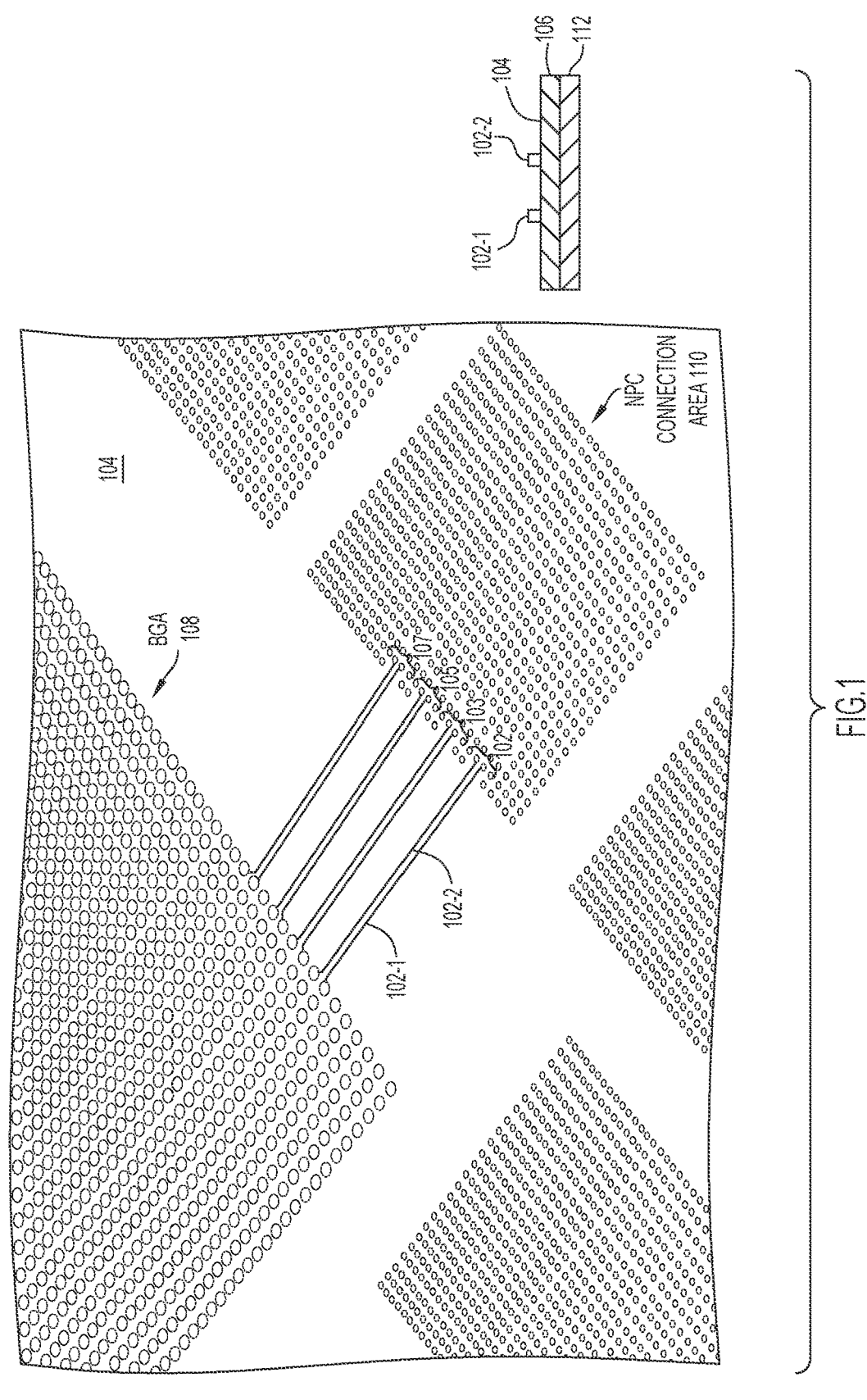
FIG. 1 illustrates a top view of a printed circuit board with traces connecting a ball grid array (BGA) to a near package copper (NPC) area, according to an example embodiment.

In one embodiment, a device is provided. The device includes a printed circuit board having a top surface; a first trace disposed directly on the top surface of the printed circuit board; a second trace disposed directly on the top surface of the printed circuit board adjacent the first trace; and a first metal dome positioned over the first trace configured to block crosstalk between the first trace and the second trace.

In another embodiment a method is provided. The method includes installing a first trace directly on a top surface of a printed circuit board; installing a second trace directly on the top surface of the printed circuit board adjacent the first trace; and positioning a first metal dome over the first trace to block crosstalk between the first trace and the second trace.

In yet another embodiment, a device is provided. The device includes a printed circuit board having an outer surface; a trace disposed directly on the outer surface of the printed circuit board; a metal dome positioned over the trace configured to block crosstalk between the trace and an adjacent trace.

Example Embodiments

High-volume system and device designs present a challenge to produce the lowest cost solution possible while enabling higher performance for each new generation of the system or device. To achieve the lowest cost/highest performance solution, printed circuit boards (PCBs) may be designed using very high loss materials and very few layers (e.g., 6 to 8 layers in some cases). Using a minimum number of layers forces much of the signal routing onto the microstrip or external layers of the PCB, particularly for routing between an application specific integrated circuit (ASIC) and a Near ASIC connector interface. Using microstrip routing is beneficial for manufacturing thin printed circuit boards with a small number of layers because the microstrip traces are placed on an outer surface of the printed circuit board instead of embedded in a layer of the printed circuit board. Microstrip routing, however, is much more susceptible to far end crosstalk (FEXT) than using traces embedded in a layer of the PCB due to the microstrip traces not having balanced dielectrics on both sides of the microstrip trace. Cables that are routed above and across boards may be used for next generation applications, such as next generation applications with 56 Gbps or greater, but the segment on the PCB for microstrip routing between the ASIC and the Near ASIC connector interface is still a large source of crosstalk.

Techniques described herein provide for a dome-like shield or structure that may be placed over the microstrip traces to improve the crosstalk performance between an integrated circuit (IC)/ASIC and a connector interface. In some embodiments, the dome-like structure may include a metal shield placed over the trace. Placing the metal shield over the trace isolates the trace from an adjacent trace to prevent or minimize crosstalk between traces. By eliminating or minimizing the crosstalk between traces, surface level traces or microstrips may be used for high speed signal routing on a printed circuit board, which reduces a number of layers required for the printed circuit board and reduces costs associated with the printed circuit board and a network device that includes the printed circuit board.

Thus, present embodiments improve the technical field of network equipment by positioning metal shields over microstrip traces on an outer surface of a printed circuit board. Present embodiments therefore increase the efficiency and lower the cost of network equipment by allowing use of the microstrip traces while eliminating or minimizing crosstalk between the microstrip traces. Thus, present embodiments provide the practical application of a network device that uses high speed signaling on a printed circuit board with a small number of layers. In particular, the present embodiments provide the practical application of eliminating or minimizing crosstalk between adjacent traces on a surface of a printed circuit board. The elimination or minimization of the crosstalk allows for a printed circuit board to be manufactured with a small number of layers that utilizes high speed signaling without the interference or crosstalk between the traces that can occur from surface-level high speed traces.

Reference is first made to FIG. 1. FIG. 1 shows a printed circuit board 100 with traces 102, 103, 105, and 107 that connect a ball grid array (BGA) 108 to a near package copper (NPC) connection area 110. BGA is a type of surface-mount packaging used for integrated circuits. NPC connection area 110 may be used as a surface-mount packaging for, for example, a Near IC/ASIC connector. The traces illustrated in FIG. 1 are microstrip traces that are positioned on a microstrip or outer surface of the printed circuit board.

In some embodiments, traces 102, 103, 105, and 107 may be differential microstrip transmission lines or conductors constructed with two parallel traces. For example, trace 102 may be constructed with a first trace 102-1 and a second trace 102-2 on the same reference plane. Traces 102-1 and 102-2 are placed directly on the outer surface 104 of PCB 100. The outer surface 104 of PCB 100 may be composed of a dielectric material. As illustrated in FIG. 1, traces 102-1 and 102-2 are approximately the same length and run parallel to each other. In other words, traces 102-1 and 102-2 are the same distance apart along the length of the traces. Although only microstrip trace 102 is labeled as having two traces, each trace 102, 103, 105, and 107 may include two parallel traces that are approximately the same length and are placed on an outer surface 104 of PCB 100.

The cross section on the right of FIG. 1 illustrates the cross section of trace 102 on PCB 100. As illustrated, traces 102-1 and 102-2 are positioned directly on the outer surface 104 of PCB. Outer surface 104 is the top surface of a dielectric layer 106. Dielectric layer 106 is positioned on top of a ground layer 112. Although only two layers are illustrated in the cross section for brevity and simplicity, PCB 100 may include additional layers.

Traces 102, 103, 105, and 107 may be used to transmit high speed signals between devices/interfaces/connectors that are connected to PCB 100 at BGA 108 and NPC connection area 110. Since traces 102, 103, 105, and 107 are on the outer surface 104 of PCB 100 and not embedded in a layer or dielectric material, crosstalk may occur between traces 102, 103, 105, and 107. Crosstalk refers to unwanted electromagnetic coupling that is created between the traces of a printed circuit board. An excessive voltage or current affecting one trace may produce unwanted effects on another trace, without the two traces being in physical contact with each other. For example, excessive voltage or current affecting trace 103 may create noise on adjacent traces 102 and 105 that may affect the signal quality of signals carried on traces 102 and 105. In some situations, excessive amounts of crosstalk may cause system failure.

It is beneficial to position traces 102, 103, 105, and 107 on the outer surface 104 of a PCB 100 to limit a number of layers associated with PCB 100 and a cost associated with manufacturing the PCB 100. However, the crosstalk associated with traces placed on an outer surface of a PCB may be greater than crosstalk associated with traces embedded in a layer of a PCB. Embodiments presented herein provide for a metal dome that spans the length of a trace and isolates the trace to block crosstalk from adjacent traces.

Figure 2A:
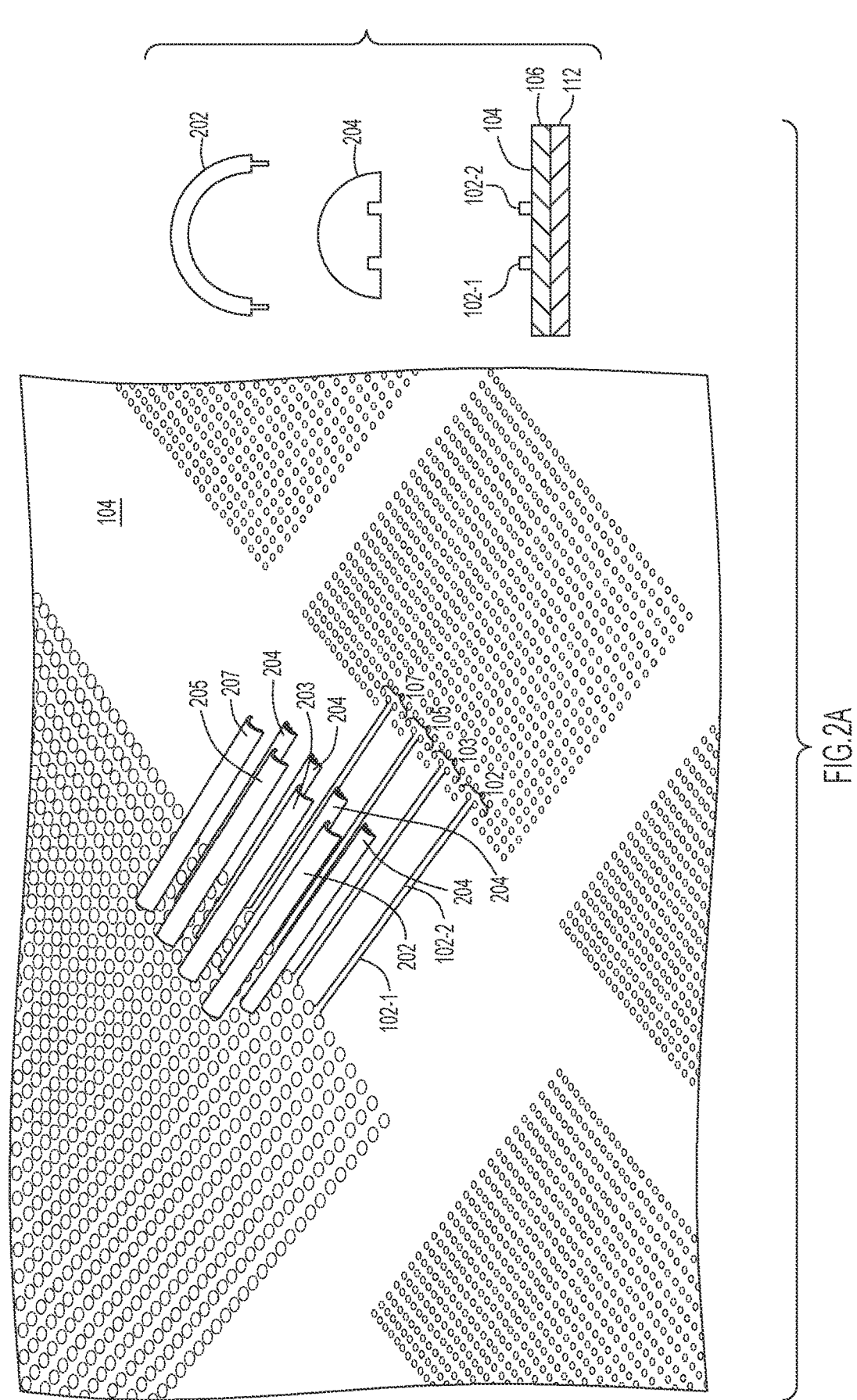
FIG. 2A illustrates metal shields prior to installation over traces on a top surface of the printed circuit board, according to an example embodiment.
Figure 2B:
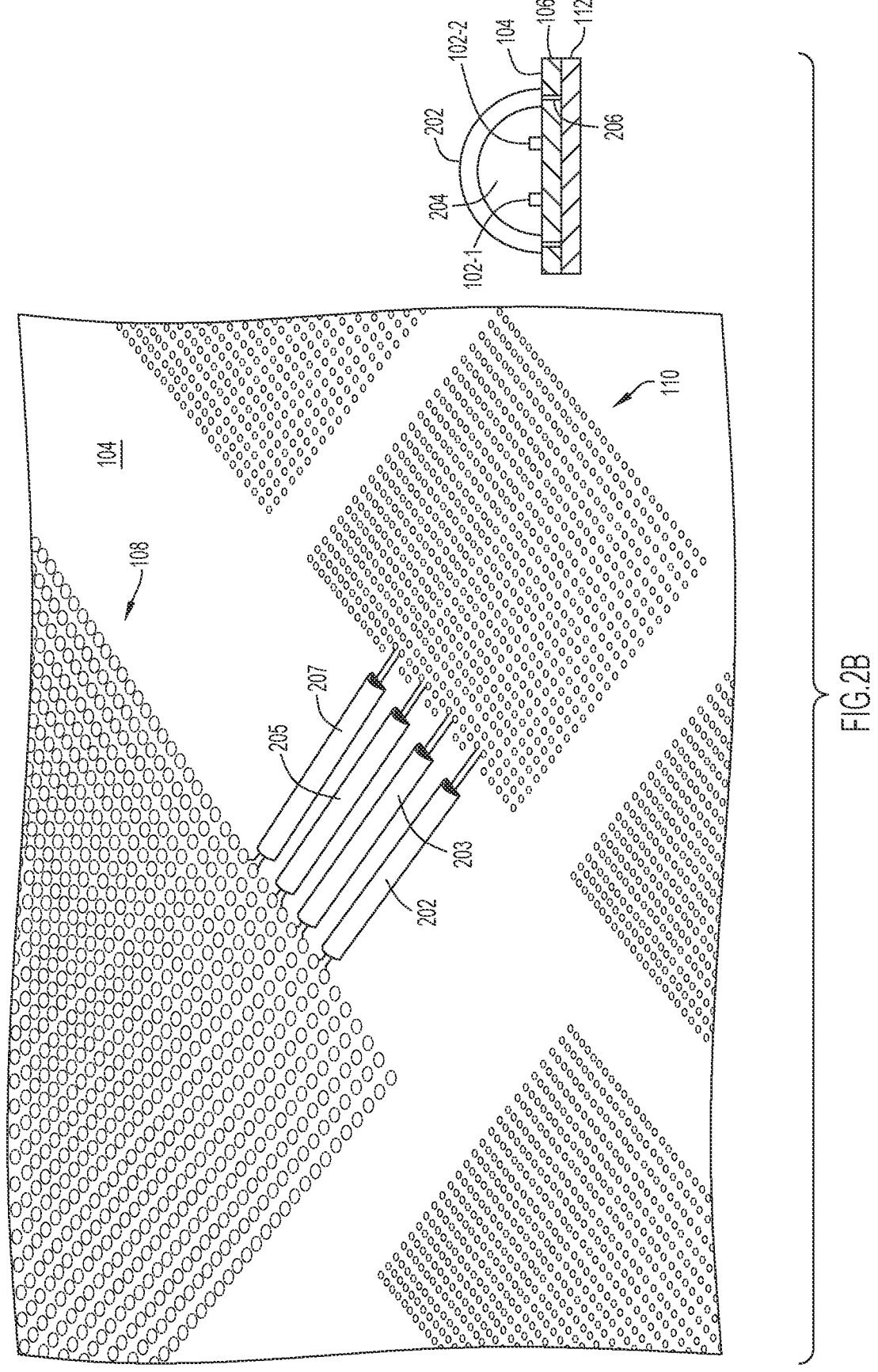
FIG. 2B illustrates metal shields that are installed over traces on the top of the printed circuit board, according to an example embodiment.

Reference is now made to FIGS. 2A and 2B. FIGS. 2A and 2B illustrate the installation of metal shields on top of traces 102, 103, 105, and 107. FIG. 2A illustrates shields 202, 203, 205, and 207 prior to the installation of the shields on top of traces 102, 103, 105, and 107. FIG. 2A additionally illustrates a deconstructed cross section of trace 102 prior to shield 202 being placed on top of trace 102. FIG. 2B illustrates shields 202, 203, 205, and 207 that are installed on top of traces 102, 103, 105, and 107. FIG. 2B additionally illustrates a cross section of trace 102 after shield 202 is placed on top of trace 102.

As discussed above, to keep the number of layers of PCB 100 and the cost associated with manufacturing PCB 100 low, traces 102, 103, 105, and 107 are placed directly on the outer surface 104 of PCB 100, which may lead to crosstalk among the traces, particularly among adjacent traces. To block the crosstalk, shields 202, 203, 205, and 207 may be placed on top of corresponding traces 102, 103, 105, and 107. Shields 202, 203, 205, and 207 may be constructed of a metal that isolates the coupling from adjacent traces. Shields 202, 203, 205, 207 may be shaped as hollow semicylinders, tunnels, or other shapes that span the length of the traces 102, 103, 105, and 107. When shields 202, 203, 205, and 207 are placed or installed over traces 102, 103, 105, and 107, crosstalk between or among traces 102, 103, 105, and 107 may be minimized or eliminated.

As illustrated in FIGS. 2A and 2B, when trace 102 is comprised of traces 102-1 and 102-2, a single shield 202 may be placed over the traces 102-1 and 102-2 such that traces 102-1 and 102-2 are covered by a single shield 202. A dielectric material 204 may be placed or inserted between the shield 202 and traces 102-1 and 102-2/outer surface 104 of PCB 100. As shown in FIG. 2B, when shield 202 and dielectric material are placed on top of traces 102-1 and 102-2, the dielectric material 204 covers the sides and tops of traces 102-1 and 102-2 and the portions of outer surface 104 that are covered by shield 202, including the portion of outer surface 104 between traces 102-1 and 102-2. In an embodiment in which trace 102 is composed of a single trace instead of two parallel traces, a shield 202 may be placed over the trace 102 and the dielectric material 204 may be inserted between the shield 202 and the outer surface 104 of PCB 100 such that the dielectric material 204 covers the trace 102 and portions of the outer surface covered by the shield 202. In both embodiments, the trace 102 or the traces 102-1 and 102-2 are surrounded by the dielectric material 204 on three sides and are in direct contact with the outer surface 104 of PCB 100 on a fourth side.

When the shield 202 is placed over trace 102, a dielectric tunnel is formed that blocks the coupling from traces 103, 105, and 107. In other words, shield 202 decreases or eliminates the crosstalk from the other traces, which improves the quality of the signals transmitted on trace 102. By eliminating or minimizing the crosstalk, high speed signals may be transmitted on traces 102, 103, 105, and 107 while maintaining the benefits of using microstrip routing (e.g., lower layer count and lower costs associated with PCB 100).

As illustrated in FIG. 2B, portions 206 of shield 202 extend through dielectric layer 106 to ground layer 112. Shield 202 is soldered into ground layer 112 at portions 206. Therefore, when shield 202 is installed over trace 102, shield 202 is grounded. Since shield 202 is installed over outer surface 104 of PCB 100, shield 202 may be easily installed over trace 102 and easily removed from trace 102.

When shield 202 and dielectric material 204 are installed over trace 102, the microstrip routing is similar to stripline-like routing while maintaining the benefits of microstrip routing. A stripline is a type of transmission line that is routed on the inner layers of a PCB between two ground planes. By installing grounded shield 202 over trace 102, a stripline-like trace is created that isolates trace 102 from crosstalk from adjacent traces while maintaining the benefits of the surface-level microstrip routing (e.g., fewer layers for PCB 100 and lower costs associated with manufacture). Since shield 202 is an external structure, shield 202 may be easily installed and removed and PCB 100 may be composed of very few layers, which enables cost-efficient manufacturing of the PCB 100.

Figure 3A:
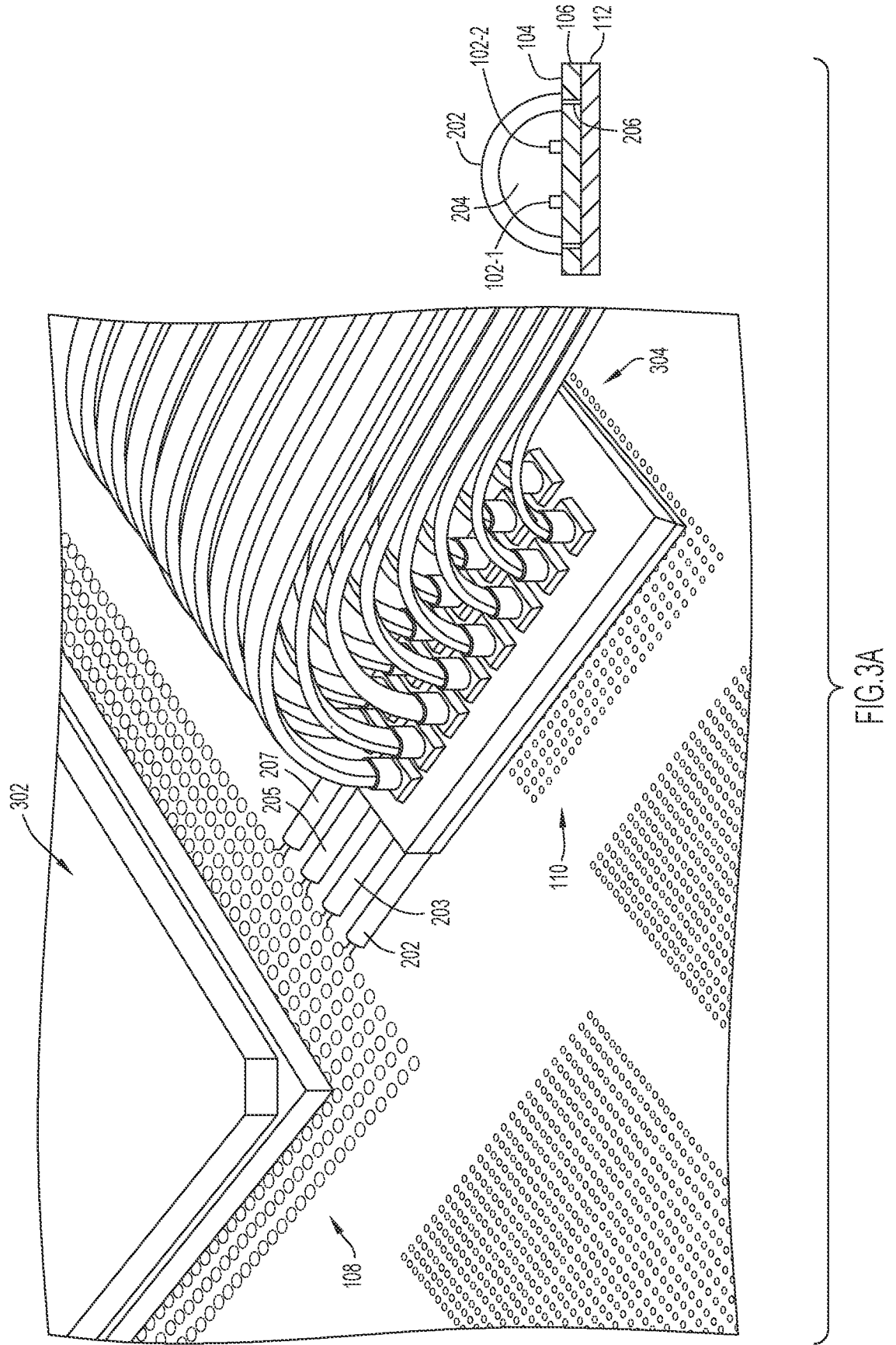
FIGS. 3A and 3B illustrate the installation of an ASIC and a Near ASIC connector with the shielded traces, according to an example embodiment.
Figure 3B:
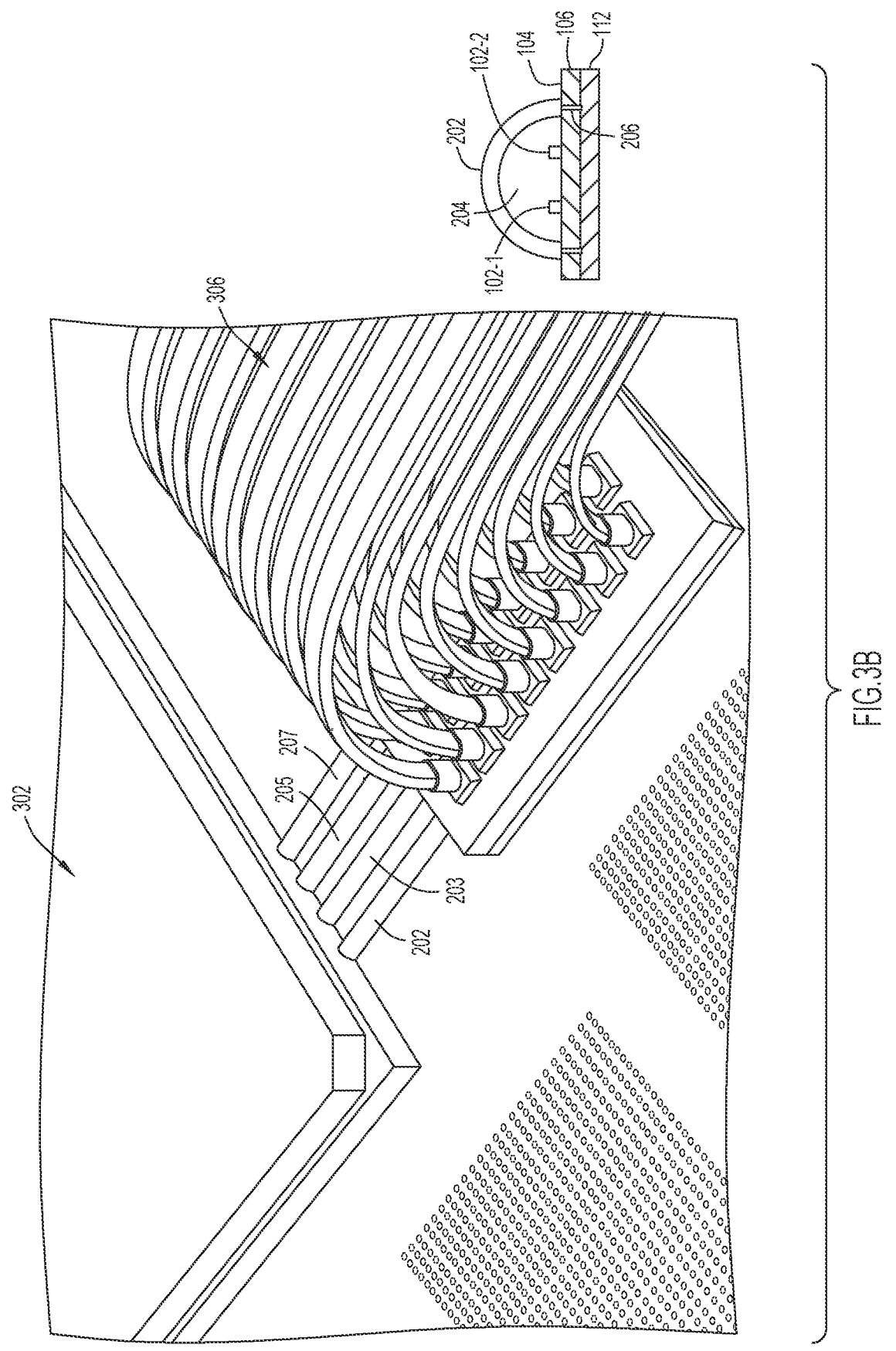

Reference is now made to FIGS. 3A and 3B. FIGS. 3A and 3B illustrate the installation of an integrated circuit (IC) or ASIC and a Near IC or ASIC connector interface on PCB 100 with the shielded traces. As illustrated in FIG. 3A, ASIC 302 may be installed at BGA 108 and NPC connector 304 may be installed at NPC connection area 110. Signals may be transmitted between ASIC 302 and NPC connector 304 via traces 102, 103, 105, and 107. The segment of PCB 100 between ASIC 302 and NPC connector 304 may be a large source of crosstalk without installation of shields 202, 203, 205, and 207.

As illustrated in FIG. 3B, when ASIC 302 and NPC connector 304 with co-packaged copper (CPC) cables 306 are installed on PCB 100, shields 202, 203, 205, and 207 span the region between ASIC 302 and NPC connector 304, completely covering the area of traces 102, 103, 105, and 107 that are not in contact with outer surface 104 to prevent or minimize crosstalk among the traces. Installation of shields 202, 203, 205, and 207 external to PCB 100 (e.g., on an outer surface of PCB 100) allows for the manufacturing of PCB 100 with a smaller number of layers (since the traces can be positioned directly on an outer surface of the PCB 100 instead of between layers of PCB 100) while minimizing or preventing the crosstalk between traces.

Figure 4:
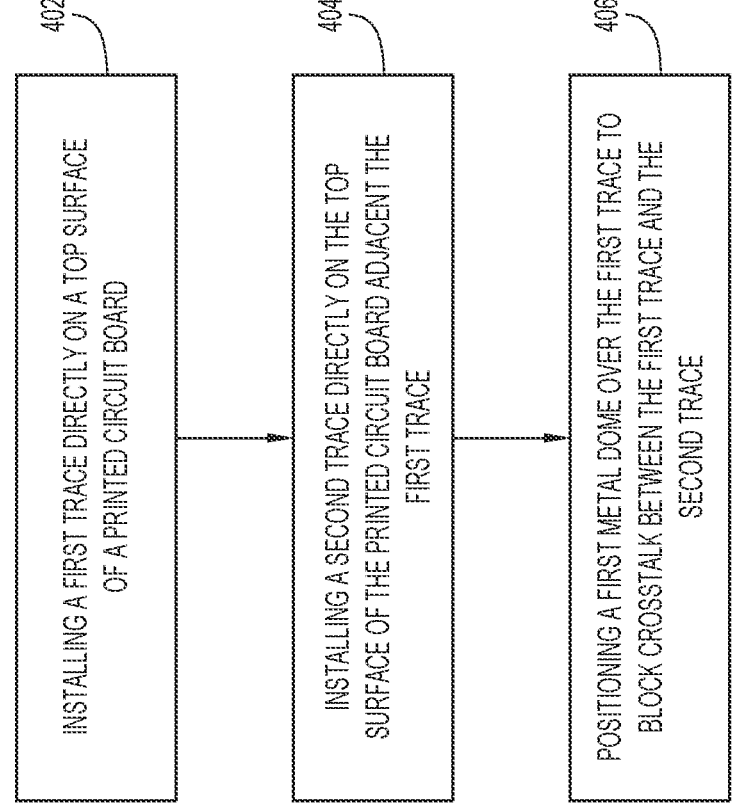
FIG. 4 is a flow chart of a method of blocking crosstalk between a first trace and a second trace, according to an example embodiment.

Reference is now made to FIG. 4. FIG. 4 is a flow chart of a method 400 of blocking crosstalk between a first trace and a second trace. At 402, a first trace is installed directly on a top surface of a printed circuit board. The first trace may be, for example, a single microstrip or two parallel microstrip conductors. At 404, a second trace is installed directly on the top surface of the printed circuit board. The second trace may include, for example, a single microstrip or two parallel microstrip conductors.

At 406, a first metal dome is positioned over the first trace to block crosstalk between the first trace and the second trace. When the first trace includes two parallel microstrip conductors, the metal dome is positioned over both of the microstrip conductors to shield or isolate the two microstrip conductors from coupling from the second trace. In addition, a dielectric material may be placed between the metal dome and the top surface of the printed circuit board so that the dielectric material covers the first trace and a portion of the top surface of the printed circuit board that is under the metal dome. The metal shield may be grounded by soldering portions of the metal shield onto a ground plane of the printed circuit board.

In one form, a device is provided comprising a printed circuit board having a top surface; a first trace disposed directly on the top surface of the printed circuit board; a second trace disposed directly on the top surface of the printed circuit board adjacent the first trace; and a first metal dome positioned over the first trace configured to block crosstalk between the first trace and the second trace.

In one example, the device further comprises an integrated circuit (IC); and a near IC connector interface, wherein the first trace and the second trace extend on the printed circuit board between the IC and the near IC connector interface. In another example, the device further comprises a second metal dome positioned over the second trace. In another example, the device further comprises a dielectric material under the first metal dome, the dielectric material covering the first trace and a portion of the top surface of the printed circuit board that is under the first metal dome.

In another example, the first metal dome is soldered to a ground plane of the printed circuit board. In another example, the first trace is a microstrip trace. In another example, the first trace includes two parallel microstrip conductors, and wherein the first metal dome is positioned over the two parallel microstrip conductors. In another example, the second trace is parallel to the first trace and includes two parallel microstrip conductors, and further including a second metal dome positioned over the two parallel microstrip conductors of the second trace.

In another form, a method is provided comprising installing a first trace directly on a top surface of a printed circuit board; installing a second trace directly on the top surface of the printed circuit board adjacent the first trace; and positioning a first metal dome over the first trace to block crosstalk between the first trace and the second trace.

In another example, a device is provided comprising a printed circuit board having an outer surface; a trace disposed directly on the outer surface of the printed circuit board; and a metal dome positioned over the trace configured to block crosstalk between the trace and an adjacent trace.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A device comprising:
a printed circuit board having a top surface;
a first trace disposed directly on the top surface of the printed circuit board;
a second trace disposed directly on the top surface of the printed circuit board adjacent the first trace; and
a first metal dome positioned on the top surface of the printed circuit board and over the first trace, the first metal dome being configured to block crosstalk between the first trace and the second trace, the first metal dome being external to the printed circuit board and removable from the printed circuit board.

2. The device of claim 1, further comprising:
an integrated circuit (IC); and
a near IC connector interface,
wherein the first trace and the second trace extend on the printed circuit board between the IC and the near IC connector interface.

3. The device of claim 1, further comprising:
a second metal dome positioned over the second trace.

4. The device of claim 1, further comprising:
a dielectric material under the first metal dome, the dielectric material covering the first trace and a portion of the top surface of the printed circuit board that is under the first metal dome.

5. The device of claim 1, wherein the first metal dome is soldered to a ground plane of the printed circuit board.

6. The device of claim 1, wherein the first trace is a microstrip trace.

7. The device of claim 1, wherein the first trace includes two parallel microstrip conductors, and wherein the first metal dome is positioned over the two parallel microstrip conductors.

8. The device of claim 1, wherein the second trace is parallel to the first trace and includes two parallel microstrip conductors, and further comprising a second metal dome positioned over the two parallel microstrip conductors of the second trace.

9. A method comprising:
installing a first trace directly on a top surface of a printed circuit board;
installing a second trace directly on the top surface of the printed circuit board adjacent the first trace; and
positioning a first metal dome on the top surface of the printed circuit board and over the first trace to block crosstalk between the first trace and the second trace, wherein the first metal dome is external to the printed circuit board and removable from the printed circuit board.

10. The method of claim 9, further comprising:

positioning an integrated circuit (IC) on the printed circuit board; and positioning a near IC connector interface on the printed circuit board, wherein the first trace and the second trace extend on the printed circuit board between the IC and the near IC connector interface.

11. The method of claim 9, further comprising:

positioning a second metal dome over the second trace.

12. The method of claim 9, further comprising:

inserting a dielectric material under the first metal dome, the dielectric material covering the first trace and a portion of the top surface of the printed circuit board that is under the first metal dome.

13. The method of claim 9, wherein the first metal dome is soldered to a ground plane of the printed circuit board.

14. The method of claim 9, wherein the first trace is a microstrip trace.

15. The method of claim 9, wherein the first trace includes two parallel microstrip conductors, and wherein the first metal dome is positioned over the two parallel microstrip conductors.

16. The method of claim 9, wherein the second trace is parallel to the first trace and includes two parallel microstrip conductors, and further comprising a second metal dome positioned over the two parallel microstrip conductors of the second trace.

17. A device comprising:

a printed circuit board having an outer surface;

a trace disposed directly on the outer surface of the printed circuit board; and a metal dome positioned on the outer surface of the printed circuit board and over the trace configured to block crosstalk between the trace and an adjacent trace, wherein the metal dome is external to the printed circuit board and removable from the printed circuit board.

18. The device of claim 17, further comprising:

a dielectric material under the metal dome, the dielectric material covering the trace and a portion of the outer surface of the printed circuit board that is under the metal dome.

19. The device of claim 17, wherein the trace includes two parallel microstrip conductors, and wherein the metal dome is positioned over the two parallel microstrip conductors.

20. The device of claim 17, wherein the adjacent trace is parallel to the trace and includes two parallel microstrip conductors, and further comprising another metal dome positioned over the two parallel microstrip conductors of the adjacent trace.

* * * * *